US005608241A

United States Patent [19]
Shibuya et al.

[11] Patent Number: 5,608,241
[45] Date of Patent: Mar. 4, 1997

[54] SEMICONDUCTOR DEVICE HAVING A MEMORY CELL PORTION AND A LOGIC PORTION

[75] Inventors: Sachiko Shibuya, Yokohama; Masayuki Yoshida, Kawasaki; Nobuyoshi Chida, Kitakami; Osamu Matsumoto, Kawasaki, all of Japan

[73] Assignee: Kabushiki Kaisha Toshiba, Kawasaki, Japan

[21] Appl. No.: 364,472

[22] Filed: Dec. 27, 1994

[30] Foreign Application Priority Data

Dec. 28, 1993 [JP] Japan .................................. 5-349070

[51] Int. Cl.⁶ ........................................... H01L 27/10
[52] U.S. Cl. ........................ 257/207; 257/208; 257/211; 257/758; 257/390
[58] Field of Search ........................... 257/296, 390, 257/211, 752, 758, 204, 206, 207, 208, 210, 756, 759, 760

[56] References Cited

U.S. PATENT DOCUMENTS 5,160,998  11/1992  Itoh et al. ............................ 257/760
5,289,037   2/1994  Savignac et al. .................... 257/758
5,441,915   8/1995  Lee ..................................... 257/211

*Primary Examiner*—Minhloan Tran
*Attorney, Agent, or Firm*—Finnegan, Henderson, Farabow, Garrett & Dunner, L.L.P.

[57] ABSTRACT

In the memory cell matrix of a semiconductor integrated circuit device having a non-volatile semiconductor memory cell portion and a logic portion, a second-layered Al wires are formed on the first-layered Al wires, with an interlayer insulating film interposed therebetween. The pattern of the second-layered Al wires is the same as that of the first-layered Al wires. This structure reduces the labor for designing mask data, and increases the coating ratio of a resist to an Al layer while minimizing a reduction in the transmittance of ultraviolet ray. As a result, the amount of a reaction compound supplied from the resist into the Al layer for forming the second-layered Al wires increases, which prevents the second-layered Al wires from being undercut. Thus, the second and subsequent-layered Al wires of the logic portion can be effectively prevented from being thinned.

10 Claims, 7 Drawing Sheets

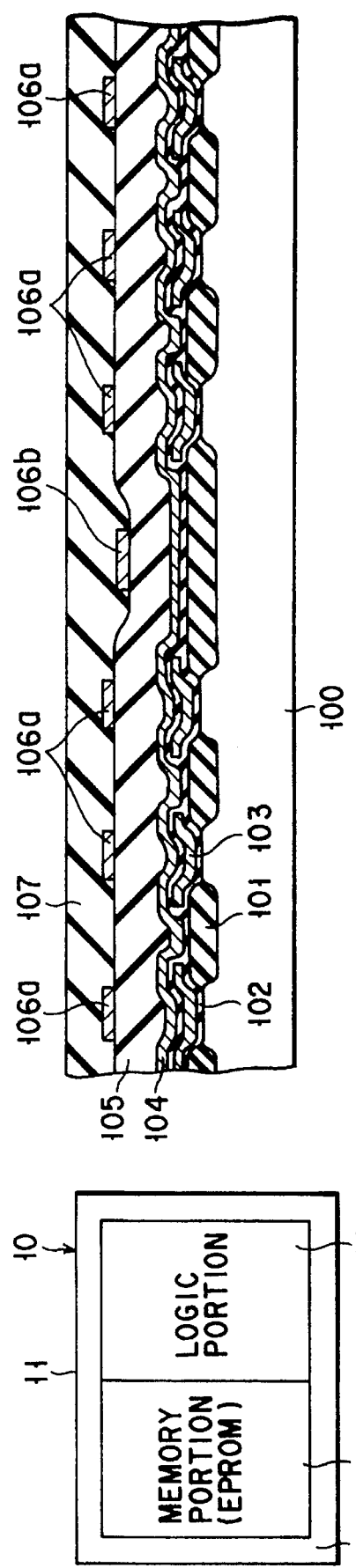
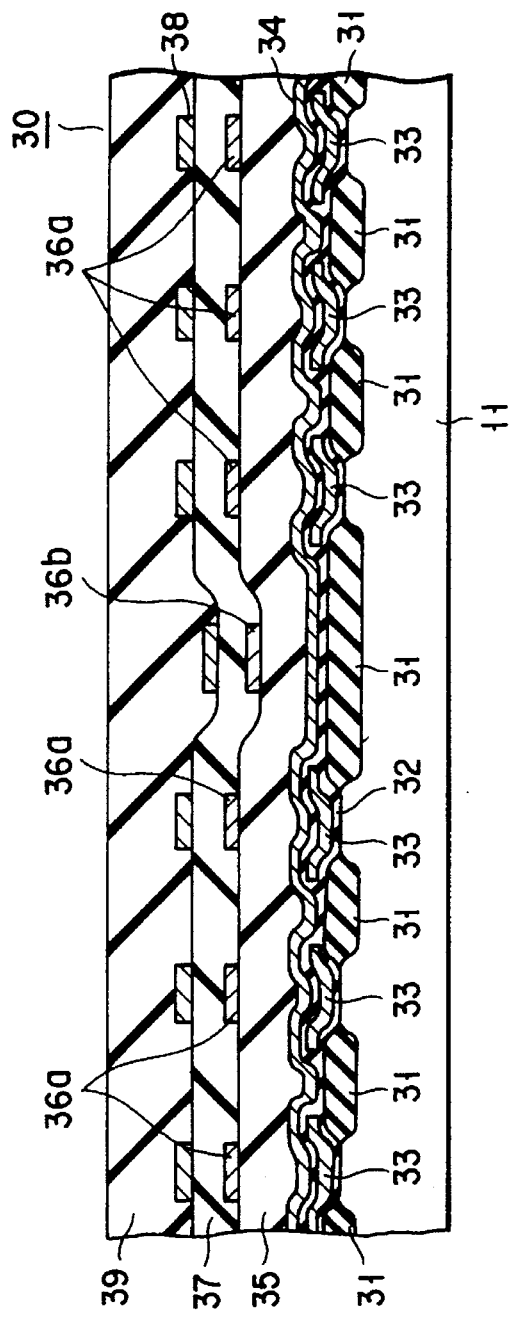
FIG. 1 PRIOR ART
FIG. 2
FIG. 3B 36a 36a 36b 36a 36a

51

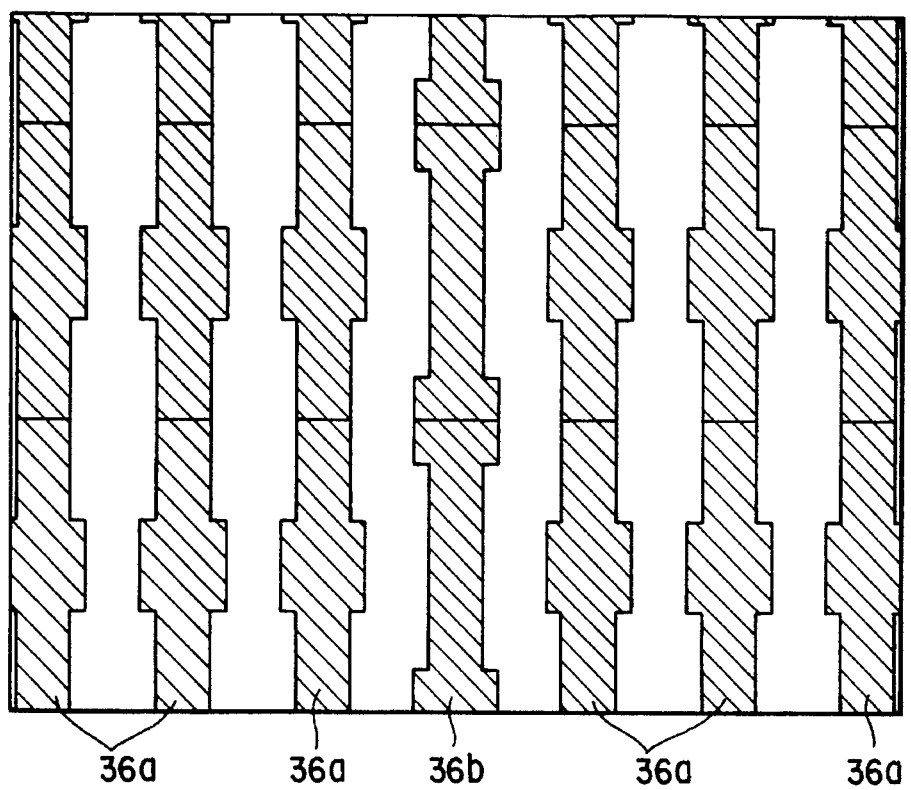
F I G. 8A
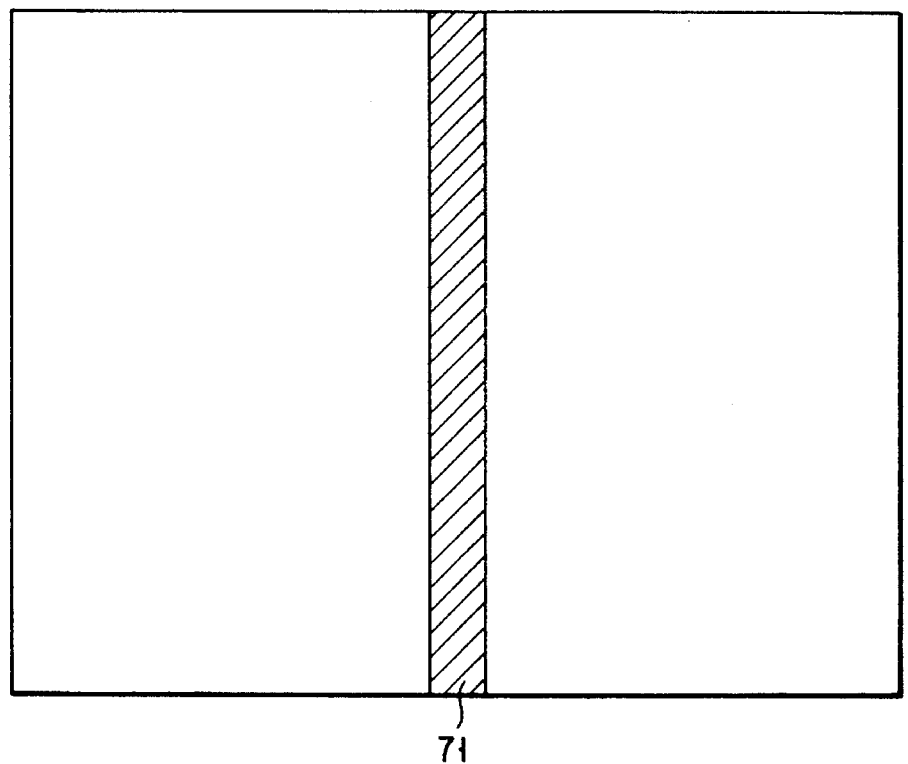
F I G. 8B

SEMICONDUCTOR DEVICE HAVING A MEMORY CELL PORTION AND A LOGIC PORTION

BACKGROUND OF THE INVENTION

1. Field of the Invention

This invention relates to a semiconductor device in which a non-volatile semiconductor memory cell portion and a logic portion comprising two or more-layered metal layers are formed on a single semiconductor substrate, and more particularly to a semiconductor integrated circuit having an erasable and programmable read only memory (EPROM) as the non-volatile semiconductor memory cell.

2. Description of the Related Art

In the prior art, a semiconductor integrated circuit device employing an EPROM is used as a semiconductor device having a semiconductor substrate, and a non-volatile semiconductor memory cell portion and a logic portion formed on the substrate.

In a semiconductor integrated circuit device of this kind, the logic portion has been developed to have multi-layered aluminum (Al) wirings in accordance with the high-integration/advanced-function tendency of the device. On the other hand, the memory cell portion (EPROM) comprises of a single Al layer in many cases, since the degree of integration is little increased by multi-layered wiring employed therein. Thus, a logic portion with two or more-layered Al wires, a memory cell portion with a single Al wire, and an I/O portion which surrounds the logic portion and the memory cell portion are formed on a single semiconductor substrate.

Further, the capacity of the EPROM has recently been increased, and the memory cell portion has been occupying more than half of the area of the semiconductor integrated circuit device.

The structure of the memory cell having a single Al wire layer will now be explained in more detail.

FIG. 1 is a cross sectional view of the memory cell portion.

As is shown in FIG. 1, the memory cell portion comprises field oxide films 101 selectively formed on a semiconductor substrate 100, floating gates 103 each formed between a corresponding adjacent pair of the field oxide films 101 with an insulating film 102 interposed therebetween, a word line 104 of polysilicon formed on the above elements with an insulating film therebetween, single-layered Al wires 106a and 106b on the word line 104 with an interlayer insulating film 105 therebetween, and a passivation film 107 protecting the surface of the device.

The Al wire 106a is a bit line connected to a drain diffusion layer (not shown) via a drain contact, and the Al wire 106b is a source line connected to a source diffusion layer (not shown) via a source contact.

In a semiconductor integrated circuit device having the memory cell portion with the single-layered Al wires 106a and 106b and a logic portion comprising two or more-layered Al layers, the second and subsequent-layered Al layers of the logic portion are liable to become thinner than its first Al layer for the following reasons.

In general, Al wires are formed by selectively etching an Al layer. This etching is influenced by the coating ratio of a photoresist pattern used as a mask to the Al layer. The lower the coating ratio of the photoresist pattern (i.e., the mask pattern), the greater the Al wire is etched due to undercut. This is because if the coating ratio is low, only a small amount of a carbon compound is supplied from the resist pattern into the Al layer during the RIE (Reactive Ion Etching), with the result that lateral-directional etching or isotripic etching of the Al layer is performed.

Since the memory cell portion does not have second and subsequent-layered Al wire layers, the coating ratios of the resist patterns to the Al layers to be selectively etched are very low at the time of selectively etching the Al layers to form Al wires of second and subsequent-layered layers of the logic portion. Accordingly, the amount of a carbon compound to be supplied from the resist pattern into the Al layers are greatly reduced, and it is highly possible that the Al layers are thinned.

In general, to prevent a metal layer, such as the Al layer, from being thinned, a dummy mask pattern, which is used only to increase the coating ratio, is formed on that portion of the metal layer, at which the coating ratio of a resist pattern to the metal layer is low, in order to increase the coating ratio. Alternatively, a simple line/space pattern is manually provided on the metal layer so as to increase the coating ratio.

However, these dummy patterns for increasing the coating ratios may well reduce the transmittance of ultraviolet ray and hence cause erase-fail of data in a semiconductor integrated circuit device with an EPROM. Thus, the dummy patterns cannot be formed on the memory cell portion.

As described above, it is very difficult to form, on the memory cell portion, a pattern which can maximize the coating ratios of the resists to the second and subsequent-layered metal layers of the logic portion, and at the same time can minimize a reduction in the transmittance of ultraviolet ray. Therefore, the conventional approach to increase the coating ratios cannot be employed to prevent the second and subsequent-layered Al layers of the logic portion from becoming thin.

SUMMARY OF THE INVENTION

It is the object of the invention to provide a semiconductor device which has high transmittance of ultraviolet ray and a high coating ratio of a resist to an Al layer, and hence wherein metal wires formed by second and subsequent-layered layers in a logic portion have a sufficient thickness.

To attain the object, according to the present invention there is provided a semiconductor device having a semiconductor substrate, a non-volatile semiconductor memory cell portion having a memory cell matrix of memory cells and a logic portion with two or more-layered metal wire layers, the memory cell portion and the logic portion being formed on the substrate, wherein the non-volatile semiconductor memory cell portion has, in the memory cell matrix, multi-layered metal wire layers having the same pattern, the multi-layered metal wire layer being aligned with each other.

According to the present invention there is further provided a semiconductor device having a semiconductor substrate, a non-volatile semiconductor memory cell portion having a memory cell matrix of memory cells and a logic portion with two or more-layered metal wire layers, the memory cell portion and the logic portion being formed on the substrate, wherein the non-volatile memory semiconductor cell portion has, in the memory cell matrix, multi-layered metal wire layers, in which (n+1)-th (n≧1) and subsequent-layered metal wire layers have a pattern identical to the pattern of a portion of an n-th metal wire layer, the portion of the n-th metal wire layer being aligned with the (n+1)-th and subsequent-layered metal wire layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross sectional view of a memory cell portion in a conventional semiconductor integrated circuit device, useful in explaining a problem of the prior art;

FIG. 2 is a plan view, showing a semiconductor integrated circuit according to an embodiment of the invention;

FIG. 3B is a cross sectional view, taken along lines IIIB—IIIB of FIG. 3A;

FIG. 8A shows a pattern of a first-layered Al wire layer in the matrix of the memory cell portion; and FIG. 8B shows another pattern of the second-layered Al wire layer in the matrix of the memory cell portion.

DETAILED DESCRIPTION OF THE PREFERRED EMBODIMENTS

Figure 3A:
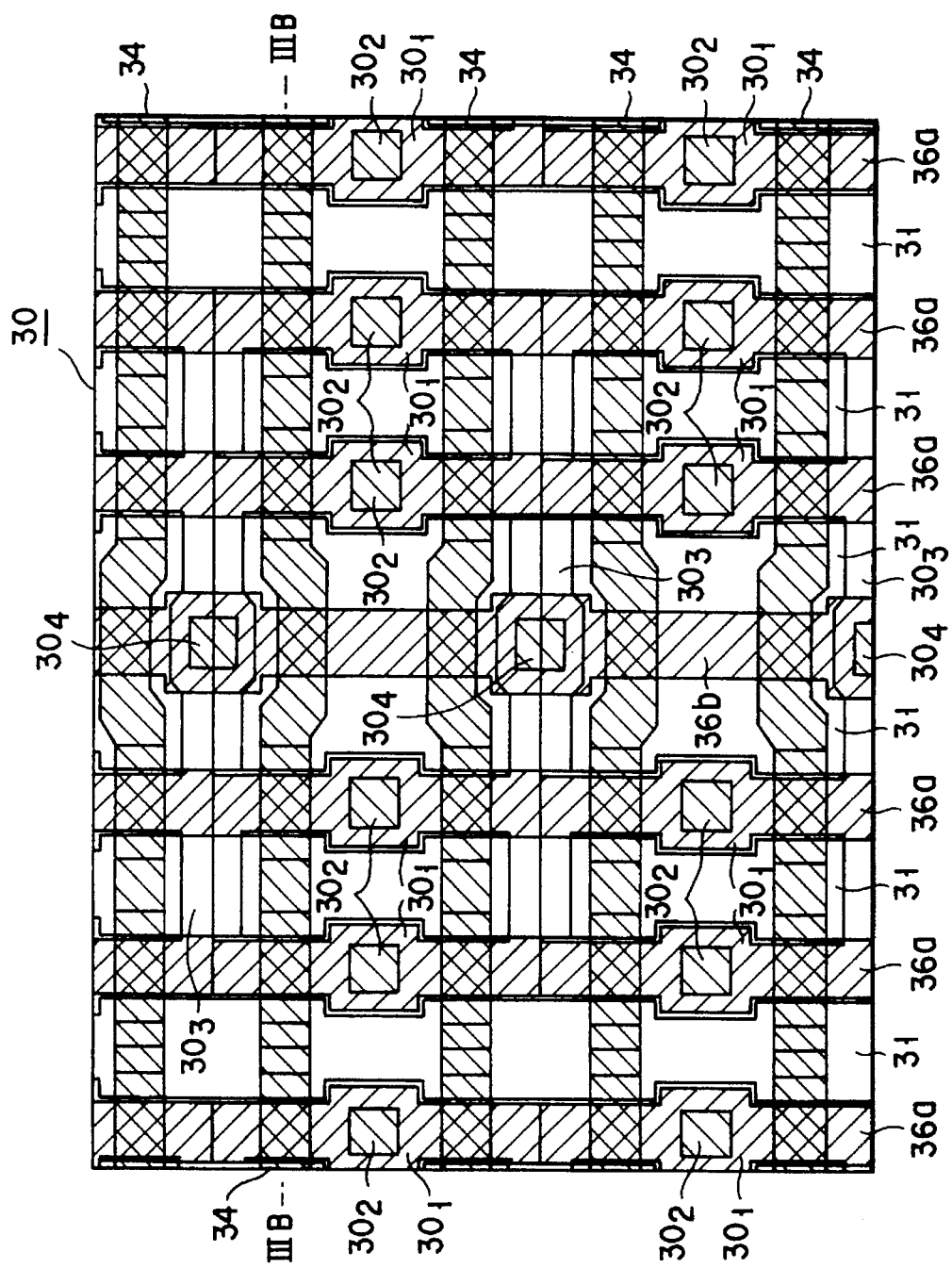
FIG. 3A is a plan view, showing a pattern of a memory cell portion in the semiconductor integrated circuit device of FIG. 2.

The embodiments of the invention will be explained with reference to the accompanying drawings.

FIG. 2 is a plan view, showing a semiconductor integrated circuit device 10 according to an embodiment of the invention, which has a non-volatile semiconductor memory cell portion and a logic portion.

The semiconductor device 10 has a semiconductor substrate 11, a logic portion 20 with two or more-layered Al wire layers formed on the substrate, a memory cell portion (EPROM) 30 with multi-layered Al wirings formed on the substrate, and an I/O portion 40 formed on the substrate and surrounding the portions 20 and 30.

FIGS. 3A and 3B show the memory cell matrix of the memory cell portion 30 in the semiconductor integrated circuit device 10. FIG. 3A is a plan view of the memory matrix, and FIG. 3B is a cross sectional view, taken along lines IIIB—IIIB of FIG. 3A.

The memory cell portion 30 comprises field oxide films 31 selectively formed on the semiconductor substrate 11, floating gates 33 each formed between a corresponding adjacent pair of the field oxide films 31 with an insulating film 32 interposed therebetween, a word line 34 of polysilicon formed on the above elements with an insulating film therebetween, first-layered Al wires 36a and 36b formed on the word line 34 with an interlayer insulating film 35 therebetween, second-layered Al wires 38 formed on the first-layered Al wires 36a and 36b with an interlayer insulating film 37 therebetween, and a passivation film 39 protecting the surface of the device.

The Al wire 36a constitutes a bit line connected to a drain region $30_1$ via a drain contact 302, and the Al wire 36b constitutes a source line connected, via a source contact $30_4$, commonly to a source region $30_3$ of each of, for example, 8 transistors. Each of the transistors constitutes a memory cell and has a floating gate 33).

Each floating gate 33 of stacked gate structure is provided under a corresponding bit line 36a, but not under the source line 36b.

The pattern of the Al wires 38 comprises a dummy pattern provided only for increasing the coating ratio. In this case, each wire 38 is in an electrically floating state, or fixed at a certain potential.

Figure 4A:
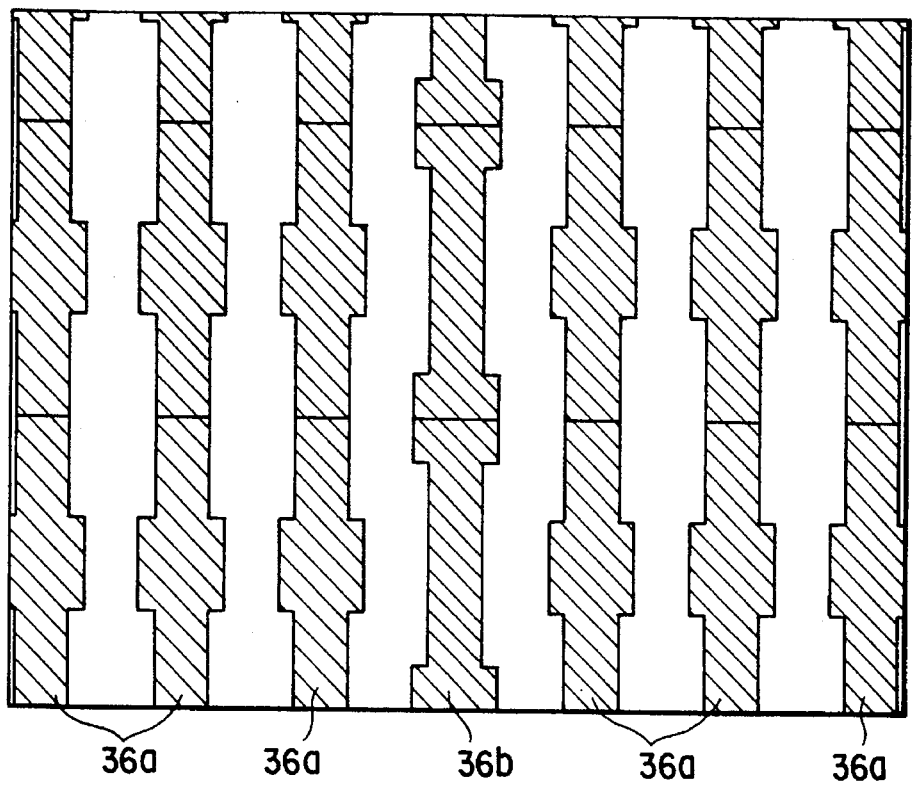
FIG. 4A shows a pattern of a first-layered Al wire layer in the matrix of the memory cell portion.
Figure 4B:
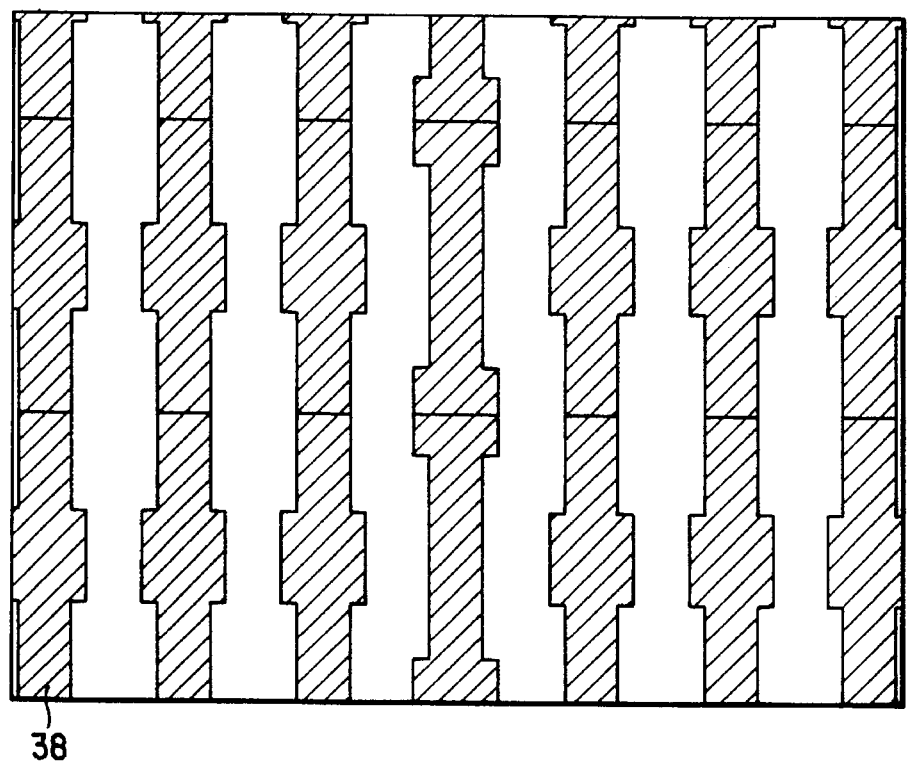
FIG. 4B shows a pattern of a second-layered Al wire layer in the matrix of the memory cell portion.

As is shown in FIG. 4B, the Al wires 38 have the same pattern as the Al wires 36a and 36b shown in FIG. 4A. These patterns are aligned with each other, with the interlayer insulating film 37 interposed therebetween.

Thus, all mask data, which are required to make a mask for forming all the second-layered Al wires in the semiconductor device 10 which has the memory cell portion 30 and the logic portion 20, are equal to the sum of pattern data for forming the Al wires 38 of the memory cell portion 30 (which data is identical to pattern data for forming the Al wires 36a and 36b of the memory cell portion 30), and pattern data for forming second-layered Al wires (not shown) in the logic portion 20.

Since the pattern data for forming the Al wires 36a and 36b can be used also to form the Al wires 38, as is evident from the above, i.e., since pattern data dedicated to the wires 38 is not necessary, great part of the labor required for designing mask data can be omitted.

Further, since the Al wires 38 are aligned with the Al wires 36a and 36b, even if the memory cell portion 30 is formed of an EPROM, the transmittance of ultraviolet ray can be prevented from greatly lowering.

Aligning the Al wires 36a and 36b with the Al wires 38 having the same pattern as that of the wires 36a and 36b can prevent the transmittance of ultraviolet ray of the memory cell portion 30 from lowering. In addition, at the time of forming second-layered Al wires (not shown) in the logic portion 20, not only a resist pattern for forming the second-layered Al wires in the logic portion 20, but also a resist pattern for forming the second-layered Al wires 38 second layer in the memory cell portion 30 are formed on an Al layer. As a result, the coating ratio of the resist pattern to the Al layer at the time of forming the second-layered Al wires (not shown) in the logic portion 20 increases.

As described above, even if the coating ratio of the resist pattern for forming the second-layered Al wires in the logic portion 20 to the Al layer is low, the total coating ratio to the Al layer can be increased by the addition of the resist pattern for forming the second-layer Al wires 38 in the memory cell portion 30. As a result, the amount of carbon compound to be supplied into the Al layer during etching can be increased, so that the second-layered Al wires in the logic portion 20 can be prevented from being undercut, and hence from being thinned.

Figure 5A:
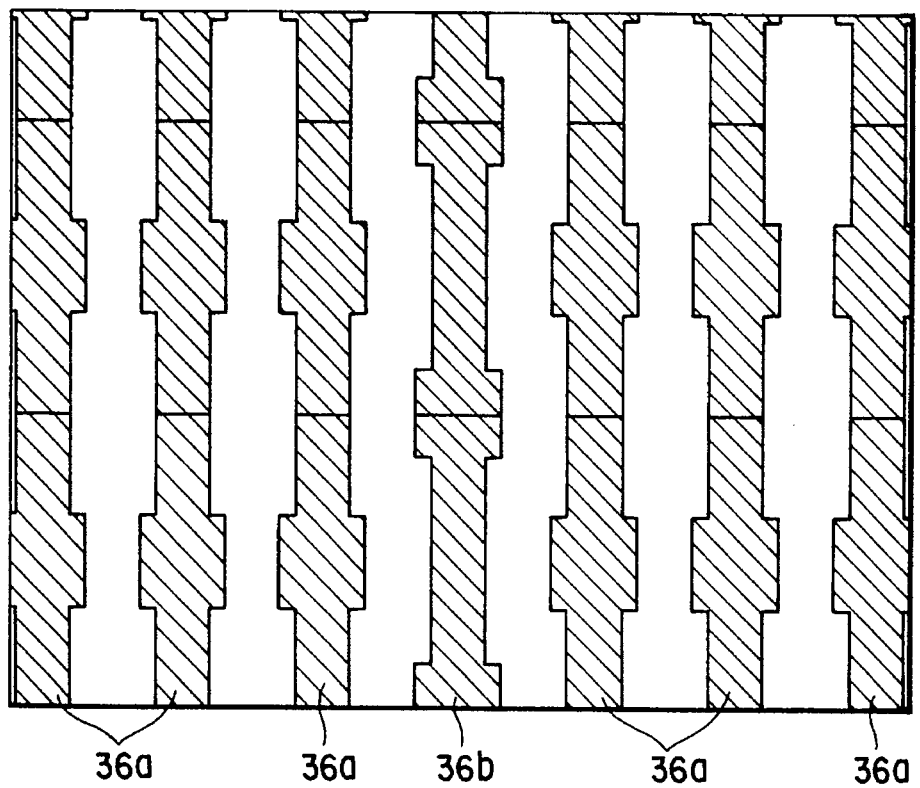
FIG. 5A shows a pattern of a first-layered Al wire layer in the matrix of the memory cell portion.
Figure 5B:
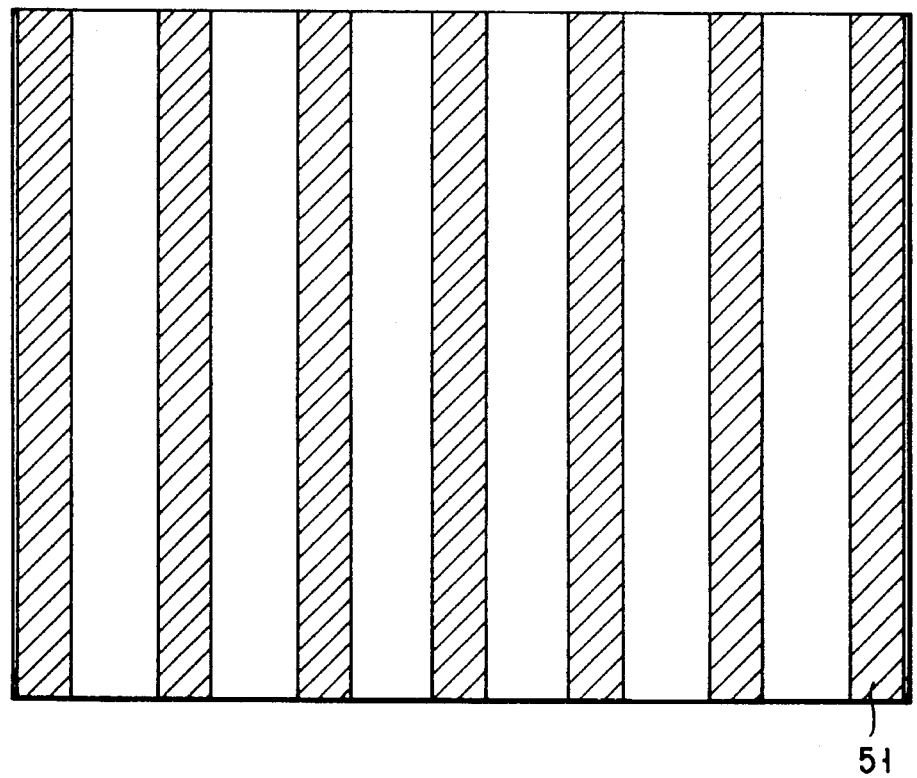
FIG. 5B shows another pattern of the second-layered Al wire layer in the matrix of the memory cell portion.

The dummy pattern 38 is not necessarily identical to that of the Al wires 36a and 36b, but may be modified like a pattern 51 shown in FIG. 5B, which has a more simple structure which does not have enlarged contact portions as shown in FIG. 5A.

In this case, mask data can be obtained by only slightly modifying the pattern data for the Al wires 36a and 36b.

As explained above, the second-layered Al wire pattern identical or substantially identical to that of the first-layered Al wire pattern is provided on the latter. In other words, the dummy pattern is formed on the first-layered Al wire pattern, with the use of the same mask data as used to form the latter pattern. Thus, multi-layered Al wire layers of the same pattern can be formed in the memory cell portion with ease, thereby reducing the time required for designing mask data of the second and subsequent-layered Al wire patterns, minimizing a reduction in the transmittance of ultraviolet ray, and maximizing the coating ratio. Accordingly, the amount of a carbon compound to be supplied to the Al layer can be increased at the time of the RIE process without reducing the transmittance of ultraviolet ray, and hence the Al wires can be prevented from being thinned due to undercut.

Figure 6:
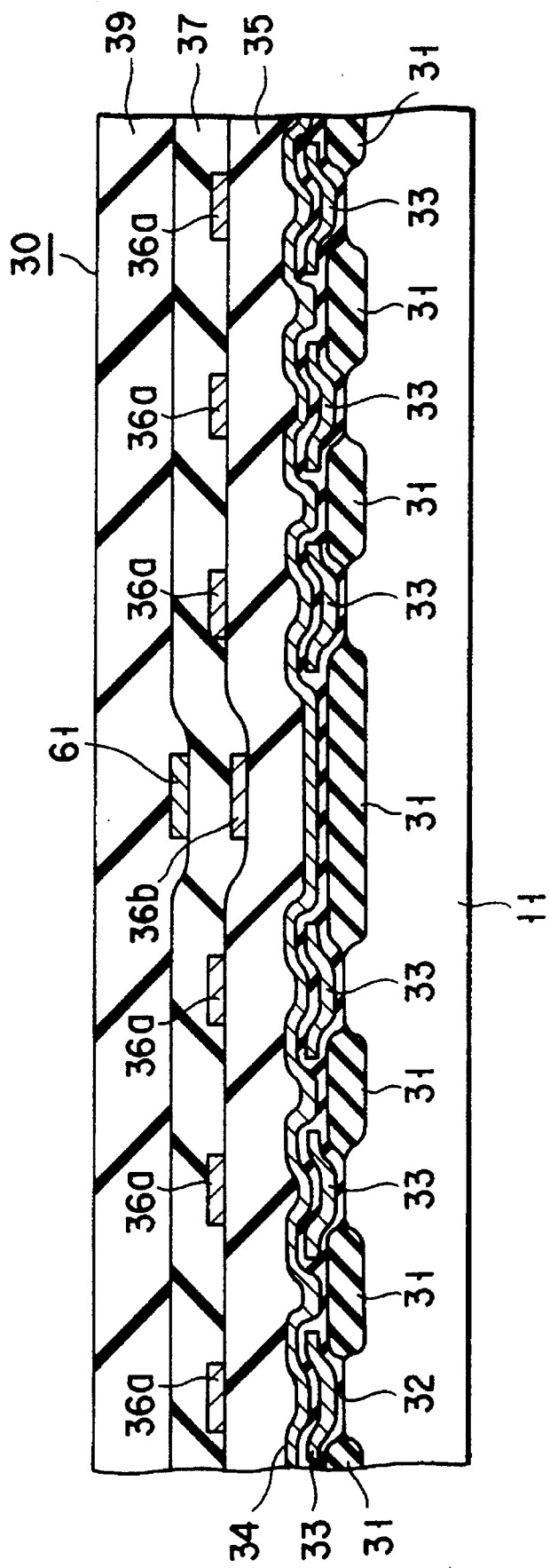
FIG. 6 is a schematic cross sectional view, showing a memory cell portion in a semiconductor integrated circuit device according to another embodiment of the invention.
Figure 7A:
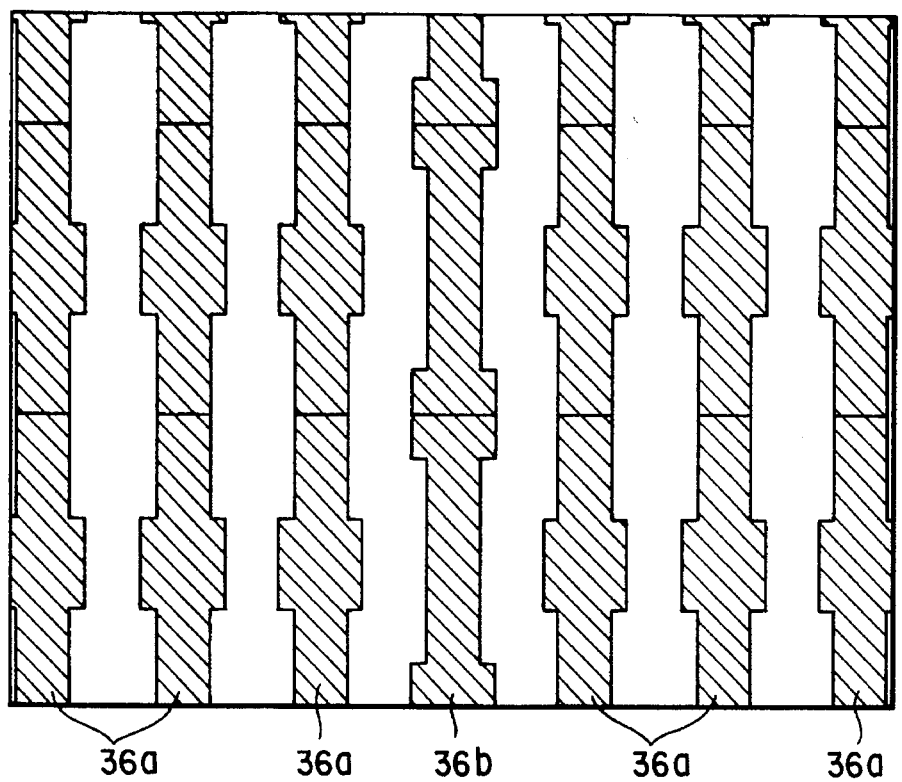
FIG. 7A shows a pattern of a first-layered Al wire layer in the matrix of the memory cell portion.
Figure 7B:
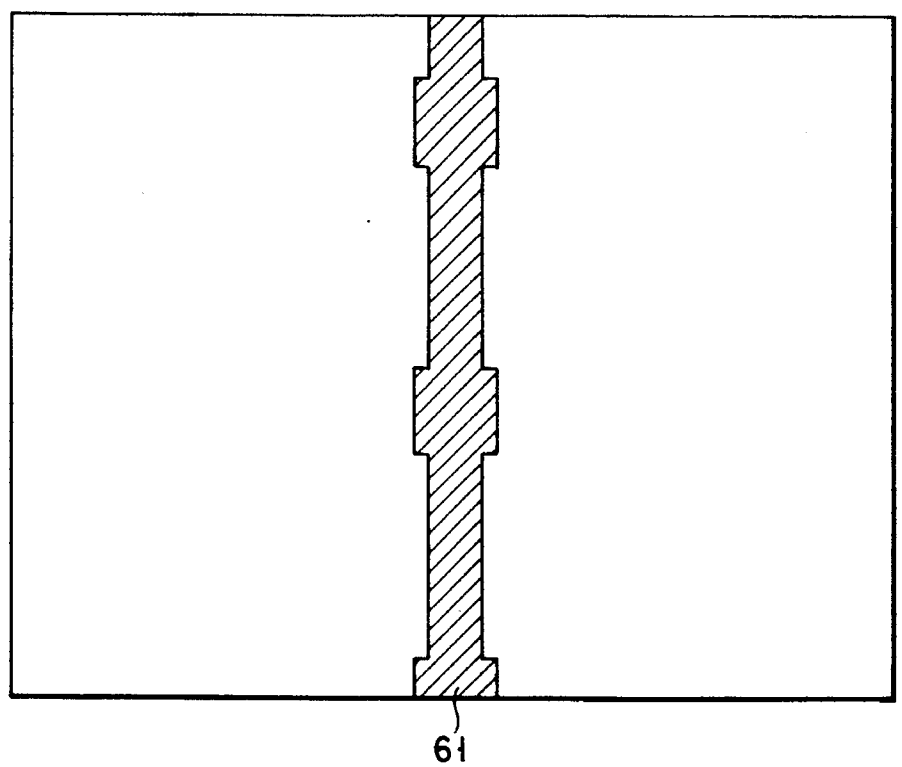
FIG. 7B shows a pattern of the second-layered Al wire layer in the matrix of the memory cell portion.

Although the above-described embodiments employ a dummy pattern which is the same or substantially the same as the first-layered Al wire pattern, the invention is not limited to this, but may be modified as follows:

In a variation shown in FIGS. 6, 7A and 7B, a dummy pattern is employed which comprises only a second-layered single Al wire 61 superposed on and aligned with the source line 36b for the memory cells of the memory cell matrix.

In another variation shown in FIGS. 8A and 8B, a dummy pattern is employed which comprises only a second-layered single Al wire 71 superposed on and aligned with the source line 36b for the memory cells of the memory matrix, and having no enlarged marginal contact portion.

Thus, all mask data, which are required to make a mask for forming all the second-layered Al wires in the semiconductor device 10 which has the memory cell portion 30 and the logic portion 20, are equal to the sum of pattern data for forming second-layered Al wires (not shown) in the logic portion 20 and that pattern data for forming the second-layered single Al wire 38 in the memory cell portion 30, which corresponds to data for forming the source pattern 36b in the memory cell portion 30; or equal to the sum of pattern data for forming second-layered Al wires (not shown) in the logic portion 20 and pattern data for forming the pattern obtained by removing the enlarged marginal contact portion from the source line 36b.

In any one of the embodiments or modifications explained with reference to FIGS. 6, 7A, 7B, 8A and 8B, a part of the Al wires 36a and 36b can be used to obtain mask data required to form the second-layered Al wire or wires in the memory cell portion 30, thereby reducing part of the labor for designing the mask data.

Further, since in the above embodiments or modifications described in relation to FIGS. 6, 7A, 7B, 8A and 8B, a dummy pattern is formed on the source line 36b, but not on the bit lines 36a, the transmittance of ultraviolet ray increases although the coating ratio slightly lowers.

Although in all the embodiments or modifications described above, the dummy pattern is a second-layered Al wire pattern, it may include each of third and subsequent-layered Al wire patterns in a case where a semiconductor integrated circuit device has three or more-layered Al wire layers.

In addition, the invention is not limited to the above-described semiconductor integrated circuit device which has an EPROM, but is applicable also to a semiconductor integrated circuit device which has an Electrically Erasable and Programmable ROM ($E^2PROM$) or a flash memory. In this case, too, second and subsequent-layered Al wires can be effectively prevented from being thinned, without much labor.

It is a matter of course that the invention can be modified in various manners without departing from the spirit and scope thereof.

In summary, the invention can provide a semiconductor device which has high transmittance of ultraviolet ray and a high coating ratio of a resist to an Al layer, and hence wherein second and subsequent-layered metal wires in a logic portion have a sufficient thickness.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device having a semiconductor substrate, a non-volatile semiconductor memory cell portion having a memory cell matrix of memory cells and a logic portion with multi-layered metal wire layers including a first wire layer and a second wire layer, the memory cell portion and the logic portion being formed on the semiconductor substrate, wherein the non-volatile semiconductor memory cell portion has multi-layered metal wire layers comprising first-layered metal wires and second-layered metal wires for preventing thinning of the second wire layer of the logic portion during an etching process, said first-layered metal wires constituting signal lines or power source lines, and said second-layered metal wires constituting a dummy wiring layer and having a pattern similar to the pattern of the first-layered metal wires and being aligned therewith to preserve light transmittance of the memory cell portion of said device.

2. The semiconductor device according to claim 1, wherein there is no floating gate of a stacked gate structure under a first-layered metal wire which constitutes a source line for the memory cells.

3. The semiconductor device according to claim 1, wherein the non-volatile semiconductor memory cell portion has an Electrically Programmable Read Only Memory (EPROM) type memory cell.

4. A semiconductor device having a semiconductor substrate, a non-volatile semiconductor memory cell portion having a memory cell matrix of memory cells and a logic portion with multi-layered metal wire layers including a first wire layer and a second wire layer, the memory cell portion and the logic portion being formed on the semiconductor substrate, wherein the non-volatile semiconductor memory cell portion has multi-layered metal wire layers comprising first-layered metal wires and second-layered metal wires for preventing thinning of the second wire layer of the logic portion during an etching process said first-layered metal wires constituting signal lines or power source lines, and said second-layered metal wires constituting a dummy wiring layer and having a pattern identical to the pattern of a portion of the first-layered metal wires and being aligned therewith to preserve light transmittance of the memory cell portion of said device.

5. The semiconductor device according to claim 4, wherein there is no floating gate of a stacked gate structure under a first-layered metal wire which constitutes a source line for the memory cells.

6. The semiconductor device according to claim 4, wherein the non-volatile semiconductor memory cell portion has an Electrically Programmable Read Only Memory (EPROM) type memory cell.

7. A semiconductor device having a semiconductor substrate, a non-volatile semiconductor memory cell portion having a memory cell matrix of memory cells and a logic portion with multi-layered metal wire layers including a first-layered metal wire layer and a second-layered metal wire layer, the memory cell portion and the logic portion being formed on the semiconductor substrate, wherein the non-volatile semiconductor memory cell portion has multi-layered metal wire layers comprising first-layered metal wires and a second-layered metal wire, said first-layered metal wires constituting signal lines or power lines, and said second-layered metal wire being in an electrically floating state or fixed to a potential and having a pattern identical to the pattern of the first-layered metal wires and being aligned with one of said first-layered metal wires for preventing thinning of the second metal wire layer of the logic portion of said device.

8. The semiconductor device according to claim 7, wherein there is no floating gate of a stacked gate structure under a first-layered metal wire which constitutes a source line for the memory cells.

9. A semiconductor device having a semiconductor substrate, a non-volatile semiconductor memory cell portion having a memory cell matrix of memory cells and a logic portion with multi-layered metal wire layers including a first-layered metal wire layer and a second-layered metal wire layer, the memory cell portion and the logic portion being formed on the semiconductor substrate, wherein the non-volatile semiconductor memory cell portion has multi-layered metal wire layers comprising first-layered metal wires and a second-layered metal wire, said first-layered metal wire layers constituting signal lines or power source lines, and said second-layered metal wire being in an electrically floating state or fixed to a potential and having a pattern similar to the pattern of the first-layered metal wires and being aligned with one of said first-layered metal wires for preventing thinning of the second metal wire layer of the logic portion of said device.

10. The semiconductor device according to claim 9, wherein there is no floating gate of a stacked gate structure under a first-layered metal wire which constitutes a source line for the memory cells.

* * * * *